United States Patent [19]
Amano et al.

[11] Patent Number: 6,140,454
[45] Date of Patent: Oct. 31, 2000

[54] ADHESIVE RESIN COMPOSITION AND SEALING RESIN COMPOSITION

[75] Inventors: Satoshi Amano; Hideshi Tomita, both of Tokyo, Japan

[73] Assignee: Nisshinbo Industries, Inc., Tokyo, Japan

[21] Appl. No.: 09/292,004

[22] Filed: Apr. 15, 1999

[30] Foreign Application Priority Data

Apr. 28, 1998 [JP] Japan .................................. 10-118692

[51] Int. Cl.⁷ .................................................. C08G 18/58
[52] U.S. Cl. ............................ 528/76; 525/481; 525/486; 525/452
[58] Field of Search .................................. 525/481, 486, 525/452; 528/76

[56] References Cited

U.S. PATENT DOCUMENTS 5,916,675  6/1999  Komoto et al. .......................... 156/289

FOREIGN PATENT DOCUMENTS 08060133  3/1996  Japan .

*Primary Examiner*—Rachel Gorr
*Attorney, Agent, or Firm*—Kubovcik & Kubovcik

[57] ABSTRACT

The present invention provides an adhesive resin composition including an epoxy resin, a phenolic resin and a polycarbodiimide resin, wherein the proportion of the polycarbodiimide resin is 0.5 to 20 parts by weight per 100 parts by weight of the total of the epoxy resin and the phenolic resin, and a sealing resin composition including an epoxy resin, a phenolic resin, a polycarbodiimide resin and an inorganic filler, wherein the proportion of the polycarbodiimide resin is 0.5 to 20 parts by weight per 100 parts by weight of the total of the epoxy resin and the phenolic resin and the proportion of the inorganic filler is 60 to 95 parts by weight of the total weight of the composition. The resin compositions of the present invention are superior in heat resistance and long-term stability and, moreover, have excellent adhesivity even to new materials such as Ni alloys and the like.

3 Claims, No Drawings

ADHESIVE RESIN COMPOSITION AND SEALING RESIN COMPOSITION

BACKGROUND OF THE INVENTION (1) Field of the Invention

The present invention relates to an adhesive resin composition and a sealing resin composition. More particularly, the present invention relates to an adhesive resin composition of improved adhesive strength, comprising an epoxy resin and a phenolic resin as the main components, as well as to a sealing resin composition which is the above adhesive resin composition plus an inorganic filler.

(2) Description of the Prior Art

Adhesive resin compositions comprising an epoxy resin and a phenolic resin as the main components are in wide use as, for example, a sealant. However, attempts have been made and are still being made in order to improve their adhesivity.

For example, in JP-A-8-12743 was made a proposal on the adhesivity improvement of the above resin composition by modification of epoxy resin skeleton; and in JP-A-8-204067 was made a proposal on the adhesivity improvement of the above resin composition by use of additive (mercapto-containing silicon compound) in combination of ordinary phenol type epoxy resin and ordinary phenolic resin.

However, in the former proposal on the adhesivity improvement of resin composition by modification of epoxy resin skeleton, there is a problem in general applicability, i.e., replacement of prior art adhesive becomes difficult due to a high cost and change of applicability; and in the latter proposal by use of additive (mercapto-containing silicon compound), there are problems of (1) offensive odor during use of the composition and (2) vaporization of silicon when heated and resultant contamination of electronic parts.

Also in JP-A-8-60133 were disclosed a hot-melt adhesive comprising a polycarbodiimide resin and a polyhydric phenolic compound, and a hot-melt adhesive further comprising an epoxy resin. These hot-melt adhesives are described to be superior in safety and operation efficiency and moreover improved in adhesivity (e.g. heat resistance).

The polycarbodiimide resin used in the above JP-A-8-60133, however, is a copolymer of 50 to 100 parts of an aliphatic polycarbodiimide resin and 0 to 50 parts of other kind of polycarbodiimide resin and contains a large proportion of an aliphatic polycarbodiimide resin; therefore, the above hot-melt adhesives are insufficient in adhesivity (e.g. heat resistance).

Further, none of conventional adhesive resin compositions has sufficient adhesivity to Ni alloy which has come to be used in recent years in, for example, lead frame of IC chip used in electronic parts, etc.

SUMMARY OF THE INVENTION

In view of the above-mentioned problems of the prior art, the present invention has been completed with an aim of providing an adhesive resin composition and a sealing resin composition based on the adhesive resin composition, both of which are superior in heat resistance and long-term stability and have excellent adhesivity even to new materials such as Ni alloy and the like.

According to the present invention, there are provided:

an adhesive resin composition comprising an epoxy resin, a phenolic resin and a polycarbodiimide resin, wherein the proportion of the polycarbodiimide resin is 0.5 to 20 parts by weight per 100 parts by weight of the total of the epoxy resin and the phenolic resin, and a sealing resin composition comprising an epoxy resin, a phenolic resin, a polycarbodiimide resin and an inorganic filler, wherein the proportion of the polycarbodiimide resin is 0.5 to 20 parts by weight per 100 parts by weight of the total of the epoxy resin and the phenolic resin and the proportion of the inorganic filler is 60 to 95 parts by weight of the total weight of the composition. (The sealing resin composition can be regarded as a combination of the adhesive resin composition and an inorganic filler.)

DETAILED DESCRIPTION OF THE INVENTION

The present invention is hereinafter described in detail.

The adhesive resin composition of the present invention is the same as conventional epoxy resin/phenolic resin compositions in that an epoxy resin and a phenolic resin are used as main components.

The epoxy resin used in the present adhesive resin composition is not a monofunctional compound but a compound having two or more epoxy groups in the molecule. Specific examples of the epoxy resin are bisphenol type aromatic epoxy resins such as bisphenol A, bisphenol F and the like; alicyclic epoxy resins such as 2,2-bis(3,4-epoxycyclohexyl) propane, 3,4-epoxycyclohexylmethylepoxycyclohexane-carboxylate and the like; high molecular weight bisphenol A type epoxy resins; cresol novolac type epoxy resins; and naphthalene type epoxy resins. These epoxy resins can be used singly or in combination of two or more kinds.

Of these solid epoxy resins, those having a melting point of 150° C. or less are preferred for easy handleability.

The phenolic resin used in the present adhesive resin composition is a compound having two or more phenolic hydroxyl groups in the molecule. Specific examples thereof are phenolic novolac resins, phenol terpene resins and cresol novolac resins.

In the present adhesive resin composition, it is possible to use, in place of the phenolic resin, a phenolic compound such as bisphenol A, bisphenol S or the like. Phenolic resins and phenolic compounds may be used in combination of two or more kinds (therefore, "the phenolic resin" as a component of the present adhesive resin composition includes a phenolic resin).

In the present adhesive resin composition, the proportions of the epoxy resin and the phenolic resin can be, for example, 0.8 to 1.2 in terms of (the epoxy equivalent of epoxy resin)/(the OH equivalent of phenolic resin). When the proportions deviate from the above range, the resulting composition tends to have low heat resistance and insufficient curability.

The polycarbodiimide resin used in the present adhesive resin composition can be a compound obtained by polymerizing at least one kind of organic diisocyanate.

The polycarbodiimide resin may also be a compound of controlled molecular weight produced by stopping the polycondensation of the organic diisocyanate at an appropriate stage using at least one kind selected from monoisocyanates and compounds having a —OH, —NH$_2$, —COOH, —SH or —NH-alkyl terminal.

The polycarbodiimide resin has a styrene-reduced number-average molecular weight of preferably 100 to 50,000, more preferably 300 to 20,0000 when measured by gel permeation chromatography (GPC) (hereinafter, "number-average molecular weight" refers to styrene-reduced number-average molecular weight).

Meanwhile, in terminal-non-blocked polycarbodiimide resins, as the number of the carbodiimide groups in molecule is smaller, the total number of terminal isocyanates in total polycarbodiimide resin is larger; therefore, carbodiimidization occurs easily and, in some cases, generation of carbon dioxide results, which is not desirable. Hence, when a terminal-non-blocked polycarbodiimide resin is used, the resin preferably has four or more carbodiimide groups in the molecule.

When a terminal-non-blocked polycarbodiimide resin is used, its number-average molecular weight is preferably 300 to 50,000, more preferably 800 to 20,000.

In order for the present adhesive resin composition to have a low melt viscosity, the polycarbodiimide resin used therein is preferably liquid at ordinary temperature. As a polycarbodiimide resin having very high fluidity, there can be mentioned, for example, a polycarbodiimide resin having a tetramethylxylylene skeleton.

Meanwhile, when there is used a polycarbodiimide resin solid at ordinary temperature, the resulting adhesive resin composition has higher heat resistance and strength. The polycarbodiimide resin solid at ordinary temperature can be used by dissolving it in a solvent and mixing the resulting solution with an epoxy resin, or by using it in a powdery state and dispersing the powder in an epoxy resin.

When the polycarbodiimide resin solid at ordinary temperature is dissolved in a solvent, the resulting solution is used per se, or is used by mixing it with an epoxy resin and removing the solvent to prepare a dispersion having fluidity at ordinary temperature. When the polycarbodiimide resin solid at ordinary temperature is used in a powdery state, the powdery polycarbodiimide resin is used by mixing it with an epoxy resin to prepare a dispersion having fluidity at ordinary temperature, or by heating the dispersion as necessary to prepare a solution.

The adhesive resin composition of the present invention comprises an epoxy resin, a phenolic resin and a polycarbodiimide resin as mentioned above. In the composition, the proportion of the polycarbodiimide resin is 0.5 to 20 parts by weight, preferably 0.5 to 2 parts by weight per 100 parts by weight of the total of the epoxy resin and the phenolic resin. When the proportion of the polycarbodiimide resin is less than 0.5 part by weight, no sufficient effect is obtained. When the proportion of the polycarbodiimide resin is more than 20 parts by weight, the resulting resin composition contains a large amount of a polycarbodiimide which causes self-curing and subsequent gelation owing to the heat applied during molding, making difficult the control of resin flow and melt viscosity during the molding.

Incidentally, in the hot-melt adhesive described in the above-mentioned JP-A-8-60133, the proportion of the polycarbodiimide used therein is 55.5 to 90.9 parts by weight per 100 parts by weight of the total of the epoxy resin and the phenolic resin also used therein.

In the present adhesive resin composition, addition of the polycarbodiimide resin to a mixture of the epoxy resin and the phenolic resin is generally conducted by uniformly dispersing a powdery polycarbodiimide resin in a mixture of an epoxy resin and a phenolic resin, by the use of a kneader. The addition may also be conducted by mixing a solution-state polycarbodiimide resin with an epoxy resin and/or a phenolic resin and then subjecting the resulting mixture to solvent removal.

The thus-obtained adhesive resin composition of the present invention is suitably used per se, or, as described below, is mixed with an inorganic filler and suitably used as a sealing resin composition.

As the inorganic filler to be mixed with the present adhesive resin composition to produce the present sealing resin composition, there can be mentioned, for example, fused silica, mica, calcium carbonate, alumina and boron nitride.

In the present sealing resin composition, the proportion of the inorganic filler can be 60 to 95 parts by weight of the total weight of the sealing resin composition. Therefore, the proportion of the other components, i.e. the adhesive resin composition can be 5 to 40 parts by weight of the total weight of the sealing resin composition.

When the proportion of the adhesive resin composition is more than 40 parts by weight of the total weight of the sealing resin composition, the resulting sealing resin composition gives a molded material of high linear expansion coefficient and high moisture absorption. When the proportion of the adhesive resin composition is less than 5 parts by weight, the resulting sealing resin composition is low in fluidity during molding and tends to show inferior molding. Therefore, none of such proportions is desirable.

In the present sealing resin composition, mixing of the inorganic filler with other components, i.e. the epoxy resin, the phenolic resin and the polycarbodiimide resin is conducted by melt kneading using a means ordinarily used, i.e. a known apparatus such as mixing roll, Banbury mixer, single or twin-screw extruder or the like.

In the present adhesive resin composition and the present sealing resin composition, there can be used components other than mentioned above, such as releasing agent (e.g. long-chain fatty acid, long-chain fatty acid ester or long-chain fatty acid amide), coloring agent (e.g. carbon black, titanium oxide or iron oxide), flame retardant (e.g. phosphorus compound, halogen compound or antimony oxide) and the like, as long as the heat resistance, long-term stability, adhesivity, etc. of the present composition are not impaired.

The present adhesive resin composition and the present sealing resin composition, obtained as above are superior in heat resistance and long-term stability and have excellent adhesivity even to new materials such as Ni alloy and the like.

Accordingly, the present sealing resin composition is suitable for use as an IC package resin composition.

EXAMPLES

The present invention is described in more detail below by way of Examples.

Synthesis of polycarbodiimide Resin (1)

In a 500-ml separable flask were placed 60.8 g of 4,4'-diphenylmethane diisocyanate (hereinafter abbreviated to MDI), 100.0 g of THF and 100 g of ethyl acetate. Further was placed 110 mg of a carbodiimidization catalyst, i.e. 1-phenyl-3-methyl-3-phosphorene-1-oxide (in the following Examples, "a carbodiimidization catalyst" refers to this compound). The resulting mixture was subjected to a reaction for 5 hours under refluxing and then cooled, whereby a white powder was formed. The white powder was collected by filtration and dried to obtain 47.3 g of a polycarbodiimide powder (1).

Synthesis of polycarbodiimide Resin (2)

In a 500-ml separable flask were placed 50.0 g of MDI, 4.25 g of phenyl isocyanate, 200 g of Perclene and 100 mg of a carbodiimidization catalyst. The resulting mixture was subjected to a reaction at 120° C. for 5 hours and then cooled to obtain a white suspension. The suspension was filtered and the filter cake was dried to obtain 40.8 g of a polycarbodiimide powder (2).

Synthesis of polycarbodiimide Resin (3)

In a 500-ml separable flask were placed 45.0 g of MDI, 3.50 g of a mixture of 2,4-tolylene diisocyanate and 2,6-tolylene diisocyanate (TDI), 4.25 g of phenyl isocyanate (PhI), 190 g of toluene and 100 mg of a carbodiimidization catalyst. The resulting mixture was subjected to a reaction for 4.5 hours under refluxing and then cooled, whereby a white powder was formed. The white powder was collected by filtration and dried to obtain 39.3 g of a polycarbodiimide powder (3).

Examples 1 to 4

The polycarbodiimide resin powder (1), (2) or (3) obtained in the above synthesis was mixed with an epoxy resin, a phenolic resin, an inorganic filler, etc. all shown in Table 1, in proportions shown in Table 1. The mixture was melt-kneaded at 80° C. by the use of a heated roll mixer and, when cooled, molded into pellets to obtain a sealing resin composition of the present invention. Using this sealing resin composition, a semiconductor substrate using a Ni—Cr alloy as the lead frame was sealed by transfer molding, to produce a QFP type semiconductor device. The device was used as a test piece.

Comparative Example 1

A sealing resin composition was produced in the same manner as in Examples 1 to 4 except that no polycarbodiimide resin powder was used. A test piece was produced also in the same manner as in Examples 1 to 4.

The test pieces obtained in Examples 1 to 4 and Comparative Example 1 were subjected to a soldering heat resistance test. The results are shown in Table 1.

Incidentally, the soldering heat resistance test was conducted as follows.

A test piece was subjected to a humidification treatment for 72 hours in an atmosphere of 85° C. and 85% humidity and then dipped in a solder bath of 250° C. for 10 seconds. This operation (1 cycle) was conducted twice (2 cycles). The test was conducted using 15 samples, for each test piece and the result was expressed as number of 15 samples which showed cracking and/or peeling.

TABLE 1

| Components | Ex. 1 | Ex. 2 | Ex. 3 | Ex. 4 | Comp. Ex. 1 |
|---|---|---|---|---|---|
| Phenolic novolac type epoxy resin | 15.7 | 15.7 | 15.7 | — | 15.7 |
| Cresol novolac type epoxy resin | — | — | — | 16.0 | |
| Phenolic resin | 9.1 | 9.1 | 9.1 | 8.6 | 9.1 |
| Curing accelerator (Triphenylphosphine) | 0.3 | 0.3 | 0.3 | 0.3 | 0.3 |
| Polycarbodiimide resin powder (1) | 2.5 | | | | — |
| Polycarbodiimide resin powder (2) | | 1.2 | | | — |
| Polycarbodiimide resin powder (3) | | | 1.2 | 1.2 | — |
| Fused silica | 75.0 | 75.0 | 75.0 | 72.0 | 71.6 |
| Soldering heat resistance test | 2/15 | 0/15 | 1/15 | 0/15 | 12/15 |

In the above, the unit of the numerical value of each component is parts by weight.

As is clear from the above, the adhesive resin composition of the present invention employs about the same simple formulation as conventional adhesive resin compositions of epoxy resin/phenolic resin type and contain an epoxy resin, a phenolic resin (these two components are main components) and a polycarbodiimide resin; the sealing resin composition of the present invention further contains an inorganic filler; both the present adhesive resin composition and the present sealing resin composition are superior in heat resistance and long-term stability and show excellent adhesivity to, for example, a Ni alloy to which sufficient adhesivity has been unobtainable.

What is claimed is:

1. An adhesive resin composition comprising an epoxy resin, a phenolic resin and a polycarbodiimide resin, wherein the proportion of the polycarbodiimide resin is 0.5 to 20 parts by weight per 100 parts by weight of the total of the epoxy resin and the phenolic resin.

2. A sealing resin composition comprising an epoxy resin, a phenolic resin, a polycarbodiimide resin and an inorganic filler, wherein the proportion of the polycarbodiimide resin is 0.5 to 20 parts by weight per 100 parts by weight of the total of the epoxy resin and the phenolic resin and the proportion of the inorganic filler is 60 to 95 parts by weight of the total weight of the composition.

3. An integrated circuit package resin composition comprising as a main component, a sealing resin composition as set forth in claim 2.

* * * * *